United States Patent
Henry et al.

(10) Patent No.: US 9,524,241 B2
(45) Date of Patent: *Dec. 20, 2016

(54) MULTI-CORE MICROPROCESSOR POWER GATING CACHE RESTORAL MECHANISM

(71) Applicant: VIA ALLIANCE SEMICONDUCTOR CO., LTD., Shanghai (CN)

(72) Inventors: G. Glenn Henry, Austin, TX (US); Dinesh K. Jain, Austin, TX (US); Stephan Gaskins, Austin, TX (US)

(73) Assignee: VIA ALLIANCE SEMICONDUCTOR CO., LTD., Shanghai (CN)

( * ) Notice: Subject to any disclaimer, the term of this patent is extended or adjusted under 35 U.S.C. 154(b) by 81 days.

This patent is subject to a terminal disclaimer.

(21) Appl. No.: 14/285,484

(22) Filed: May 22, 2014

(65) Prior Publication Data

US 2015/0339231 A1 Nov. 26, 2015

(51) Int. Cl.
*G06F 12/08* (2016.01)
*G06F 9/44* (2006.01)
(Continued)

(52) U.S. Cl.
CPC ......... *G06F 12/0844* (2013.01); *G06F 9/4418* (2013.01); *G11C 17/16* (2013.01);
(Continued)

(58) Field of Classification Search
CPC . G11C 17/16; G11C 17/18; G11C 2209/4402; G11C 7/20; G11C 29/787; G06F 12/0692; G06F 12/0811; G06F 2212/283; G06F 12/12; G06F 1/3275; G06F 2212/69; G06F 2212/601; G06F 12/0844; G06F 9/4418

See application file for complete search history.

(56) References Cited

U.S. PATENT DOCUMENTS 5,155,484 A 10/1992 Chambers, IV
5,513,346 A 4/1996 Satagopan et al.
(Continued)

FOREIGN PATENT DOCUMENTS

CN 1357893 A 7/2002
CN 101180608 A 5/2008
(Continued)

*Primary Examiner* — Hashem Farrokh
(74) *Attorney, Agent, or Firm* — Richard K. Huffman; James W. Huffman

(57) ABSTRACT

An apparatus includes a fuse array and a stores. The fuse array is disposed on a die, and is programmed with compressed configuration data for a plurality of cores. The stores is coupled to the plurality of cores, and includes a plurality of sub-stores that each correspond to each of the plurality of cores, where one of the plurality of cores accesses the semiconductor fuse array upon power-up/reset to read and decompresses the compressed configuration data, and stores a plurality of decompressed configuration data sets for one or more cache memories within the each of the plurality of cores in the plurality of sub-stores, and where, following a power gating event, one of the each of the plurality of cores subsequently accesses a corresponding one of the each of the plurality of sub-stores to retrieve and employ the decompressed configuration data sets to initialize the caches.

21 Claims, 7 Drawing Sheets

MICROPROCESSOR FUSE ARRAY COMPRESSION SYSTEM

(51) Int. Cl.
    *G11C 17/18* (2006.01)
    *G11C 17/16* (2006.01)
    *G11C 29/44* (2006.01)
(52) U.S. Cl.
    CPC ........ *G11C 17/18* (2013.01); *G06F 2212/601* (2013.01); *G11C 2029/4402* (2013.01)

(56) References Cited

U.S. PATENT DOCUMENTS

| | | | |
|---|---|---|---|
| 5,745,734 A | 4/1998 | Craft et al. |
| 5,784,625 A | 7/1998 | Walker |
| 5,889,679 A | 3/1999 | Henry et al. |
| 6,028,445 A | 2/2000 | Lawman |
| 6,330,712 B1 | 12/2001 | Iwaya |
| 6,349,395 B2 | 2/2002 | Ohuchi et al. |
| 6,525,678 B1 | 2/2003 | Veenstra et al. |
| 6,577,156 B2 | 6/2003 | Anand et al. |
| 6,748,518 B1 | 6/2004 | Guthrie et al. |
| 6,772,356 B1 | 8/2004 | Qureshi et al. |
| 6,888,774 B2 | 5/2005 | Suzuki et al. |
| 6,924,663 B2 | 8/2005 | Masui et al. |
| 7,251,756 B2 | 7/2007 | Anand et al. |
| 7,304,899 B2 | 12/2007 | Gerstmeier et al. |
| 7,308,598 B2 | 12/2007 | Beattie et al. |
| 7,310,757 B2 | 12/2007 | Ngo et al. |
| 7,328,335 B1 | 2/2008 | Sundararajan et al. |
| 7,350,119 B1 | 3/2008 | Zuraski, Jr. et al. |
| 7,383,423 B1 | 6/2008 | Hughes et al. |
| 7,415,640 B1 | 8/2008 | Zorian et al. |
| 7,529,992 B1 | 5/2009 | Teig et al. |
| 7,663,957 B2 | 2/2010 | Henry et al. |
| 7,702,978 B2 | 4/2010 | Lewis et al. |
| 7,710,813 B1 | 5/2010 | Im et al. |
| 7,757,135 B2 | 7/2010 | Nadeau-Dostie et al. |
| 7,795,899 B1 | 9/2010 | Grohoski et al. |
| 7,805,761 B2 | 9/2010 | Lewis et al. |
| 7,839,707 B2 | 11/2010 | Askjer |
| 8,112,681 B2 | 2/2012 | Khoja et al. |
| 8,194,489 B2 | 6/2012 | Bentley et al. |
| 8,242,800 B2 | 8/2012 | Henry et al. |
| 8,484,543 B2 | 7/2013 | Anand et al. |
| 8,537,627 B2 | 9/2013 | Ouellette et al. |
| 8,719,648 B2 | 5/2014 | Gorman et al. |
| 8,724,418 B2 | 5/2014 | Kim et al. |
| 8,843,795 B2 | 9/2014 | Nakaya |
| 8,879,345 B1 * | 11/2014 | Henry .................... G11C 17/16 |
| | | | 365/189.2 |
| 2004/0019763 A1 | 1/2004 | Lakhani et al. |
| 2006/0004942 A1 | 1/2006 | Hetherington et al. |
| 2006/0131743 A1 | 6/2006 | Erickson et al. |
| 2006/0203578 A1 | 9/2006 | Meaney et al. |
| 2008/0008015 A1 | 1/2008 | Darbinyan et al. |
| 2008/0046891 A1 | 2/2008 | Sanchorawala et al. |
| 2008/0065937 A1 | 3/2008 | Micheloni et al. |
| 2008/0263490 A1 | 10/2008 | Lewis et al. |
| 2009/0045867 A1 | 2/2009 | Kwong et al. |
| 2009/0080232 A1 | 3/2009 | Chen et al. |
| 2009/0097335 A1 * | 4/2009 | Taniguchi ............ G11C 29/789 |
| | | | 365/189.12 |
| 2009/0204751 A1 | 8/2009 | Kushita |
| 2010/0229062 A1 | 9/2010 | Henry et al. |
| 2011/0035623 A1 | 2/2011 | Gaskins et al. |
| 2012/0096241 A1 | 4/2012 | Bell, Jr. et al. |
| 2012/0166763 A1 | 6/2012 | Henry et al. |
| 2013/0022951 A1 | 1/2013 | Hughes |
| 2013/0033951 A1 | 2/2013 | Gorman et al. |
| 2013/0070514 A1 | 3/2013 | Weiss et al. |
| 2013/0091312 A1 | 4/2013 | Ken et al. |
| 2013/0166944 A1 * | 6/2013 | Park ..................... G11C 29/802 |
| | | | 714/6.3 |
| 2015/0338904 A1 | 11/2015 | Henry et al. |
| 2015/0338905 A1 | 11/2015 | Henry et al. |
| 2015/0339232 A1 | 11/2015 | Henry et al. |

FOREIGN PATENT DOCUMENTS

| | | |
|---|---|---|
| CN | 101493809 A | 7/2009 |
| CN | 103377711 A | 10/2012 |
| CN | 104538059 A | 4/2015 |
| CN | 104570830 A | 4/2015 |
| CN | 104572335 A | 4/2015 |
| CN | 104575610 A | 4/2015 |

* cited by examiner

PRESENT DAY MICROPROCESSOR FUSE ARRAY MECHANISM

PRESENT DAY MICROPROCESSOR FUSE ARRAY

MICROPROCESSOR FUSE ARRAY COMPRESSION SYSTEM

EXEMPLARY COMPRESSED TYPE FORMAT

EXEMPLARY EXPANDED FORMAT – MICROCODE PATCH FUSES

EXEMPLARY EXPANDED FORMAT – MICROCODE REGISTER FUSES

EXEMPLARY EXPANDED FORMAT – CACHE CORRECTION FUSES

ALTERNATIE EXEMPLARY EXPANDED FORMAT – CACHE CORRECTION FUSES

EXEMPLARY FUSE CORRECTION FORMAT

APPARATUS FOR RESTORAL FROM A POWER GATING EVENT

MULTI-CORE MICROPROCESSOR POWER GATING CACHE RESTORAL MECHANISM

CROSS-REFERENCE TO RELATED APPLICATIONS

This application is related to the following co-pending U.S. patent applications, each of which has a common assignee and common inventors.

| SER. NO. | FILING DATE | TITLE |
|---|---|---|
| 13/972,297 (CNTR.2617) | Aug. 21, 2013 | APPARATUS AND METHOD FOR STORAGE AND DECOMPRESSION OF CONFIGURATION DATA |
| 13/972,358 (CNTR.2672) | Aug. 21, 2013 | MULTI-CORE FUSE DECOMPRESSION MECHANISM |
| 13/972,414 (CNTR.2673 | Aug. 21, 2013 | EXTENDED FUSE REPROGRAMMABILITY MECHANISM |
| 13/972,481 (CNTR.2674) | Aug. 21, 2013 | APPARATUS AND METHOD FOR EXTENDED CACHE CORRECTION |
| 13/972,657 (CNTR.2675) | Aug. 21, 2013 | CORE-SPECIFIC FUSE MECHANISM FOR A MULTI-CORE DIE |
| 13/972,609 (CNTR.2686) | Aug. 21, 2013 | APPARATUS AND METHOD FOR CONFIGURABLE REDUNDANT FUSE BANKS |
| 13/972,690 (CNTR.2687) | Aug. 21, 2013 | APPARATUS AND METHOD FOR RAPID FUSE BANK ACCESS IN A MULTI-CORE PROCESSOR |
| 13/972,725 (CNTR.2697) | Aug. 21, 2013 | MULTI-CORE MICROPROCESSOR CONFIGURATION DATA COMPRESSION AND DECOMPRESSION SYSTEM |
| 13/972,741 (CNTR.2698) | Aug. 21, 2013 | APPARATUS AND METHOD FOR COMPRESSION OF CONFIGURATION DATA |
| 13/972,768 (CNTR.2699) | Aug. 21, 2013 | MICROPROCESSOR MECHANISM FOR DECOMPRESSION OF FUSE CORRECTION DATA |
| 13/972,785 (CNTR.2700) | Aug. 21, 2013 | MICROPROCESSOR MECHANISM FOR DECOMPRESSION OF CACHE CORRECTION DATA |
| 13/972,794 (CNTR.2705) | Aug. 21, 2013 | APPARATUS AND METHOD FOR COMPRESSION AND DECOMPRESSION OF MICROPROCESSOR CONFIGURATION DATA |
| 13/972,812 (CNTR.2706) | Aug. 21, 2013 | CORRECTABLE CONFIGURATION DATA COMPRESSION AND DECOMPRESSION SYSTEM |
| (CNTR.2732) | — | MULTI-CORE APPARATUS AND METHOD FOR RESTORING DATA ARRAYS FOLLOWING A POWER GATING EVENT |
| (CNTR.2776) | — | MULTI-CORE DATA ARRAY POWER GATING RESTORAL MECHANISM |
| (CNTR.2778 | — | APPARATUS AND METHOD FOR REPAIRING CACHE ARRAYS IN A MULTI-CORE MICROPROCESSOR |

BACKGROUND OF THE INVENTION

Field of the Invention

This invention relates in general to the field of microelectronics, and more particularly to apparatus and methods for restoring compressed cache repair data following a multi-core power gating event.

Description of the Related Art

Integrated device technologies have exponentially advanced over the past 40 years. More specifically directed to the microprocessor fields, starting with 4-bit, single instruction, 10-micrometer devices, the advances in semiconductor fabrication technologies have enabled designers to provide increasingly more complex devices in terms of architecture and density. In the 80's and 90's, so-called pipeline microprocessors and superscalar microprocessors were developed comprising millions of transistors on a single die. And now 20 years later, 64-bit, 32-nanometer devices are being produced that have billions of transistors on a single die, and which comprise multiple microprocessor cores for the processing of data.

One requirement that has persisted since these early microprocessors were produced is the need to initialize these devices with configuration data when they are powered up or when they are reset. For example, many architectures enable devices to be configured to execute at one of many selectable frequencies and/or voltages. Other architectures require that each device have a serial number and other information that can be read via execution of an instruction. Yet other devices require initialization data for internal registers and control circuits. Still other microprocessors, particularly that with on-board cache memories, utilize repair data to implement redundant circuits within these memories to correct for fabrication errors.

As one skilled in the art will appreciate, designers have traditionally employed semiconductor fuse arrays on-die to store and provide initial configuration and repair data. These fuse arrays are generally programmed by blowing selected fuses therein after a part has been fabricated, and the arrays contain thousands of bits of information which are read by a corresponding device upon power-up/reset to initialize and configure the device for operation.

As device complexity has increased over the past years, the amount of configuration/repair data that is required for a typical device has proportionately increased. Yet, as one skilled in the art will appreciate, though transistor size shrinks in proportion to the semiconductor fabrication process employed, semiconductor fuse size increases due to the unique requirements for programming fuses on die. This phenomenon, in and of itself, is a problem for designers, who are prevalently constrained by real estate and power considerations. In other words, there is just not enough real estate on a given die to fabricate a huge fuse array.

In addition, the ability to fabricate multiple device cores on a single die has geometrically exacerbated the problem, because configuration requirements for each of the cores result in a requirement for a number of fuses on die, in a single array or distinct arrays, that is proportional to the number of cores disposed thereon.

Furthermore, as one skilled in the art will appreciate, multiple-core devices utilize complex power-saving modes of operation that result in one or more of the cores being powered down in a so-called power gating event (or, "sleep mode") when not in use. Consequently, when a core is powered up following a power gating event, the same requirement for initialization, configuration, and repair persists, except that initialization speed requirements are much more stringent.

Therefore, what is needed is apparatus and methods that enable configuration/repair data to be stored and provided to a multi-core device that require significantly less real estate and power on a single die than that which has heretofore been provided.

In addition, what is needed is a fuse array mechanism that can store and provide significantly more configuration/repair data than current techniques while requiring the same or less real estate on a multi-core die.

Furthermore, what is needed is a technique that facilitates prompt initialization, configuration, and repair of a multi-core device following a power gating event.

SUMMARY OF THE INVENTION

The present invention provides a superior technique for restoring configuration data following a power gating event. In one aspect, an apparatus for providing configuration data to an integrated circuit is considered. The apparatus includes a semiconductor fuse array and a stores. The semiconductor fuse array is disposed on a die, and is programmed with compressed configuration data for a plurality of cores disposed on the die, and coupled to the semiconductor fuse array. The stores is coupled to the plurality of cores, and includes a plurality of sub-stores that each correspond to each of the plurality of cores, where one of the plurality of cores is configured to access the semiconductor fuse array upon power-up/reset to read and decompress the compressed configuration data, and to store a plurality of decompressed configuration data sets for one or more cache memories within the each of the plurality of cores in the plurality of sub-stores, and where, following a power gating event, one of the each of the plurality of cores subsequently accesses a corresponding one of the each of the plurality of sub-stores to retrieve and employ the decompressed configuration data sets to initialize the one or more caches.

One aspect of the present invention contemplates an apparatus for providing configuration data to an integrated circuit device. The apparatus includes a multi-core microprocessor. The multi-core microprocessor has a semiconductor fuse array and a stores. The semiconductor fuse array is disposed on a die, and is programmed with compressed configuration data for a plurality of cores disposed on the die, and coupled to the semiconductor fuse array. The stores is coupled to the plurality of cores, and includes a plurality of sub-stores that each correspond to each of the plurality of cores, where one of the plurality of cores is configured to access the semiconductor fuse array upon power-up/reset to read and decompress the compressed configuration data, and to store a plurality of decompressed configuration data sets for one or more cache memories within the each of the plurality of cores in the plurality of sub-stores, and where, following a power gating event, one of the each of the plurality of cores subsequently accesses a corresponding one of the each of the plurality of sub-stores to retrieve and employ the decompressed configuration data sets to initialize the one or more caches.

Another aspect of the present invention comprehends a method for configuring an integrated circuit. The method includes first disposing a semiconductor fuse array on a die, into which is programmed compressed configuration data for a plurality of cores disposed on the die, and coupled to the semiconductor fuse array; and second disposing a stores on the die, the stores comprising a plurality of sub-stores that each correspond to each of the plurality of cores, where one of the plurality of cores is configured to access the semiconductor fuse array upon power-up/reset to read and decompress the compressed configuration data, and to store a plurality of decompressed configuration data sets for one or more cache memories within the each of the plurality of cores in the plurality of sub-stores, and where, following a power gating event, one of the each of the plurality of cores subsequently accesses a corresponding one of the each of the plurality of sub-stores to retrieve and employ the decompressed configuration data sets to initialize the one or more caches.

Regarding industrial applicability, the present invention is implemented within a MICROPROCESSOR which may be used in a general purpose or special purpose computing device.

BRIEF DESCRIPTION OF THE DRAWINGS

These and other objects, features, and advantages of the present invention will become better understood with regard to the following description, and accompanying drawings where.

DETAILED DESCRIPTION

Figure 1:
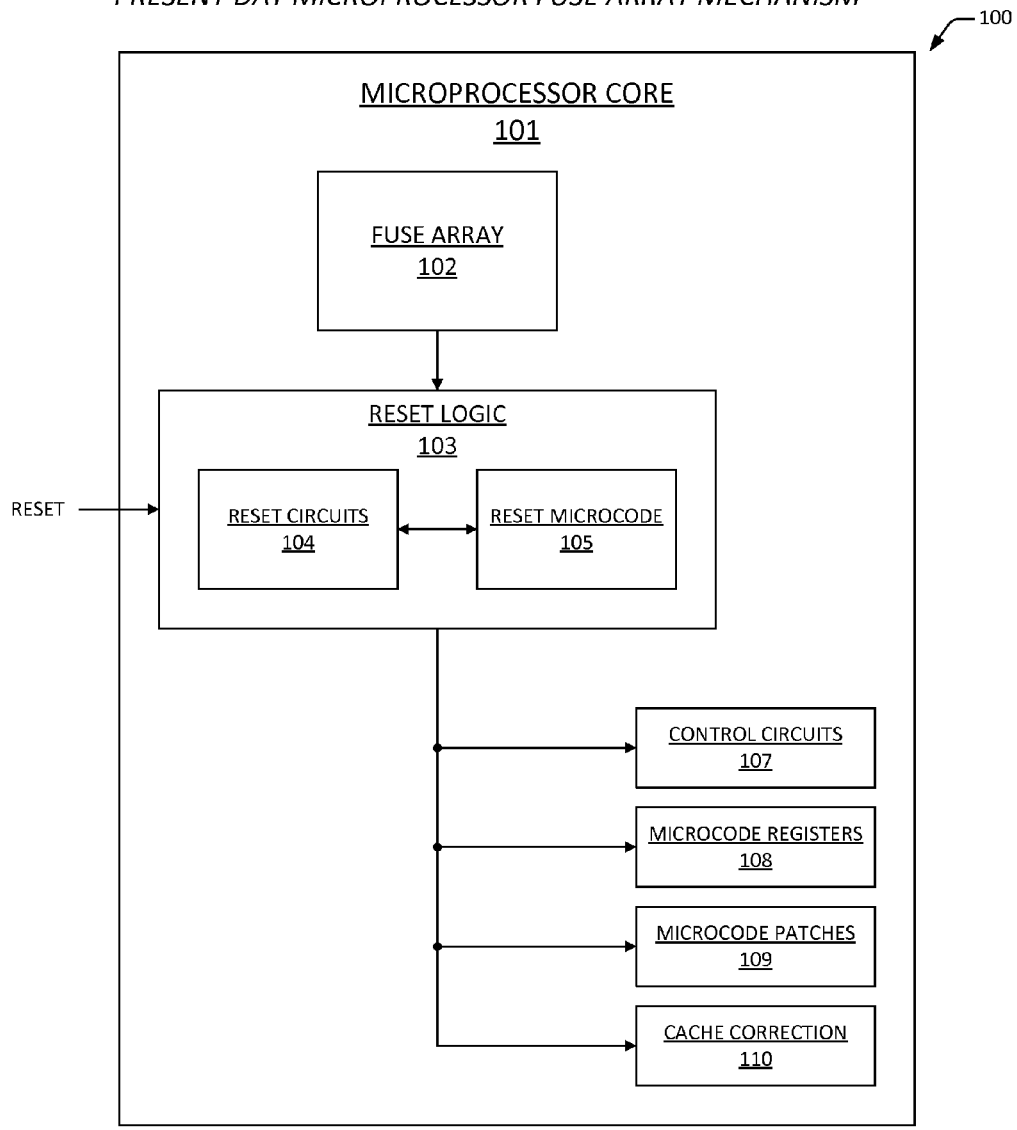
FIG. 1 is a block diagram illustrating a present day microprocessor core that includes a fuse array for providing configuration data to the microprocessor core.

Exemplary and illustrative embodiments of the invention are described below. In the interest of clarity, not all features of an actual implementation are described in this specification, for those skilled in the art will appreciate that in the development of any such actual embodiment, numerous implementation specific decisions are made to achieve specific goals, such as compliance with system-related and business related constraints, which vary from one implementation to the next. In addition, it will be appreciated that such a development effort might be complex and time-consuming, but would nevertheless be a routine undertaking for those of ordinary skill in the art having the benefit of this disclosure. Various modifications to the preferred embodiment will be apparent to those skilled in the art, and the general principles defined herein may be applied to other embodiments. Therefore, the present invention is not intended to be limited to the particular embodiments shown and described herein, but is to be accorded the widest scope consistent with the principles and novel features herein disclosed.

The present invention will now be described with reference to the attached figures. Various structures, systems, and devices are schematically depicted in the drawings for purposes of explanation only and so as to not obscure the present invention with details that are well known to those skilled in the art. Nevertheless, the attached drawings are included to describe and explain illustrative examples of the present invention. The words and phrases used herein should be understood and interpreted to have a meaning consistent with the understanding of those words and phrases by those skilled in the relevant art. No special definition of a term or phrase (i.e., a definition that is different from the ordinary and customary meaning as understood by those skilled in the art) is intended to be implied by consistent usage of the term or phrase herein. To the extent that a term or phrase is intended to have a special meaning (i.e., a meaning other than that understood by skilled artisans) such a special definition will be expressly set forth in the specification in a definitional manner that directly and unequivocally provides the special definition for the term or phrase.

Figure 2:
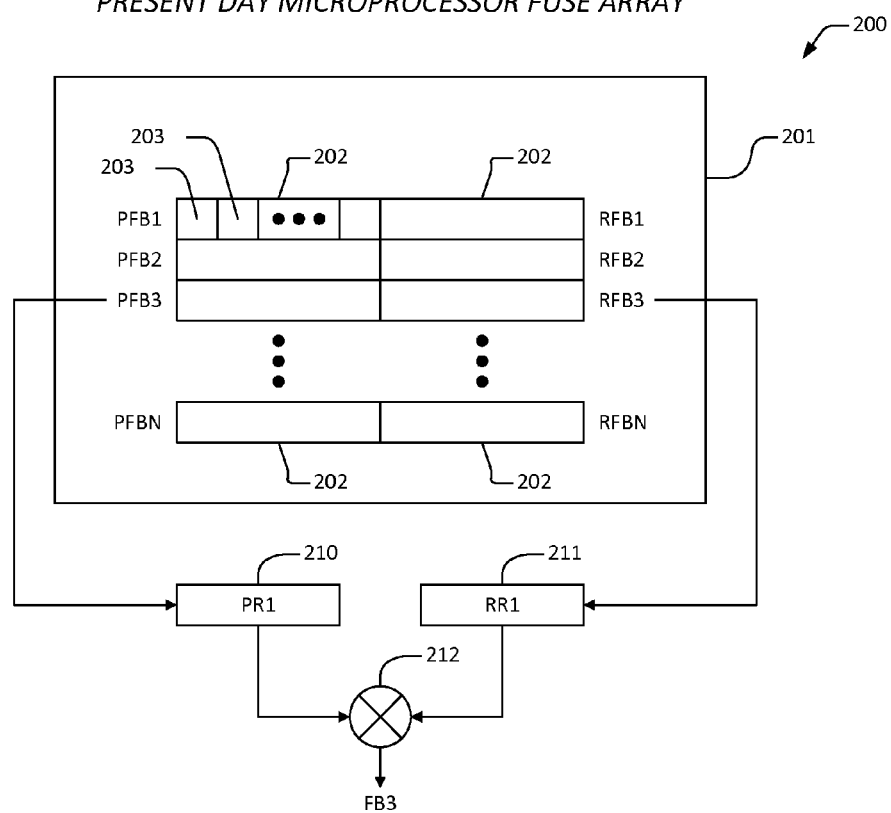
FIG. 2 is a block diagram depicting a fuse array within the microprocessor core of FIG. 1 which includes redundant fuse banks that may be blown subsequent to blowing first fuse banks within the fuse array.

In view of the above background discussion on device fuse arrays and associated techniques employed within present day integrated circuits for providing configuration data during initial power-up, a discussion of the limitations and disadvantages of those techniques will be presented with reference to FIGS. 1-2. Following this, a discussion of the present invention will be presented with reference to FIGS. 3-10. The present invention overcomes all of the limitations and disadvantages discussed below by providing apparatus and methods for employing compressed configuration in a multi-core die which utilize less power and real estate on the multi-core die, which provide for expeditious restoral of configuration and repair data following power gating events, and which are more reliable than that which has heretofore been provided.

DEFINITIONS

Integrated Circuit (IC): A set of electronic circuits fabricated on a small piece of semiconductor material, typically silicon. An IC is also referred to as a chip, a microchip, or a die.

Central Processing Unit (CPU): The electronic circuits (i.e., "hardware") that execute the instructions of a computer program (also known as a "computer application," "application program," "program," or "application") by performing operations on data that include arithmetic operations, logical operations, and input/output operations.

Microprocessor: An electronic device that functions as a CPU on a single integrated circuit. A microprocessor receives digital data as input, processes the data according to instructions fetched from a memory (either on-die or off-die), and generates results of operations prescribed by the instructions as output. A general purpose microprocessor may be employed in devices including, but not limited to, a desktop, mobile, or tablet computer, and may be utilized for tasks such as, but not limited to, computation, text editing, multimedia display, and Internet browsing. A microprocessor may also be disposed in an embedded system to control a wide variety of devices that include appliances, mobile telephones, smart phones, and industrial control devices.

Multi-Core Processor: Also known as a multi-core microprocessor, a multi-core processor is a microprocessor having multiple CPUs (also known as "cores") fabricated on a single integrated circuit.

Instruction Set Architecture (ISA) or Instruction Set: A part of a computer architecture related to programming that includes data types, instructions, registers, addressing modes, memory architecture, interrupt and exception handling, and input/output. An ISA includes a specification of the set of opcodes (i.e., machine language instructions), and the native commands implemented by a particular CPU.

x86-Compatible Microprocessor: A microprocessor capable of executing computer applications that are programmed according to the x86 ISA.

Microcode: A term employed to refer to a plurality of micro instructions. A micro instruction (also referred to as a "native instruction") is an instruction at the level that a microprocessor sub-unit executes. Exemplary sub-units include integer units, floating point units, MMX units, and load/store units. For example, micro instructions are directly executed by a reduced instruction set computer (RISC) microprocessor. For a complex instruction set computer (CISC) microprocessor such as an x86-compatible microprocessor, x86 instructions are translated into associated micro instructions, and the associated micro instructions are directly executed by a sub-unit or sub-units within the CISC microprocessor.

Fuse: A conductive structure typically arranged as a filament which can be broken at select locations by applying a voltage across the filament and/or current through the filament. Fuses may be deposited at specified areas across a die topography using well known fabrication techniques to produce filaments at all potential programmable areas. A fuse structure is blown (or unblown) subsequent to fabrication to provide for desired programmability of a corresponding device disposed on the die.

Turning to FIG. 1, a block diagram 100 is presented illustrating a present day microprocessor core 101 that includes a fuse array 102 for providing configuration data to the microprocessor core 101. The fuse array 102 comprises a plurality of semiconductor fuses (not shown) typically arranged in groups known as banks. The fuse array 102 is coupled to reset logic 103 that includes both reset circuits 104 and reset microcode 105. The reset logic 103 is coupled to control circuits 107, microcode registers 108, microcode patches elements 109, and cache correction elements 110. An external reset signal RESET is coupled to the microprocessor core 101 and is routed to the reset logic 103.

As one skilled in the art will appreciate, fuses (also called "links" or "fuse structures") are employed in a vast number of present day integrated circuit devices to provide for configuration of the devices after the devices have been fabricated. For example, consider that the microprocessor core 101 of FIG. 1 is fabricated to provide functionality selectively either as a desktop device or a mobile device. Accordingly, following fabrication, prescribed fuses within the fuse array 102 may be blown to configure the device as, say, a mobile device. Accordingly, upon assertion of RESET, the reset logic 103 reads the state of the prescribed fuses in the fuse array 102 and the reset circuits 104 (rather than reset microcode 105, in this example) enable corresponding control circuits 107 that deactivate elements of the core 101 exclusively associated with desktop operations and activate elements of the core 101 exclusively associated with mobile operations. Consequently, the core 101 is configured upon power-up reset as a mobile device. In addition, the reset logic 103 reads the state of the other fuses in the fuse array 102 and the reset circuits 104 (rather than reset microcode 105, in this example) enable corresponding cache correction circuits 107 provide corrective mechanisms for one or more cache memories associated (not shown) with the core 101. Consequently, the core 101 is configured upon power-up reset as a mobile device and corrective mechanisms for its cache memories are in place.

The above example is merely one of many different uses for configuration fuses in an integrated circuit device such as a microprocessor core 101 of FIG. 1. One skilled in the art will appreciate that other uses for configuration fuses include, but are not limited to, configuration of device specific data (e.g., serial numbers, unique cryptographic keys, architecture mandated data that can be accessed by users, speed settings, voltage settings), initialization data, and patch data. For example, many present day devices execute microcode and often require initialization of registers 108 that are read by the microcode. Such initialization data may be provided by microcode register fuses (not shown) within the fuse array 102, which are read upon reset and provided to the microcode registers 108 by the reset logic 103 (using either the reset circuits 104, the reset microcode 105, or both elements 104-105). For purposes of the present application, the reset circuits 104 comprise hardware elements that provide certain types of configuration data, which cannot be provided via the execution of the reset microcode 105. The reset microcode 105 comprises a plurality of micro instructions disposed within an internal microcode memory (not shown) that is executed upon reset of the core 101 to perform functions corresponding to initialization of the core 101, those functions including provision of configuration data that is read from the fuse array 102 to elements such as microcode registers 108 and microcode patch mechanisms 109. The criteria for whether certain types of configuration data provided via fuses can be distributed to the various elements 107-110 in the core 101 via reset microcode 105 or not is a function primarily of the specific design of the core 101. It is not the intent of the present application to provide a comprehensive tutorial on specific configuration techniques that are employed to initialize integrated circuit devices, for one skilled in the art will appreciate that for a present day microprocessor core 101 the types of configurable elements 107-110 generally fall into four categories as are exemplified in FIG. 1: control circuits, microcode registers, microcode patch mechanisms, and cache correction mechanisms. Furthermore, one skilled will appreciate that the specific values of the configuration data significantly vary based upon the specific type of data. For instance, a 64-bit control circuit 107 may include ASCII data that prescribes a serial number for the core 101. Another 64-bit control register may have 64 different speed settings, only one of which is asserted to specify an operating speed for the core 101. Microcode registers 108 may typically be initialized to all zeros (i.e. logic low states) or to all ones (i.e., logic high states). Microcode patch mechanisms 109 may include an approximately uniform distribution of ones and zeros to indicate addresses in a microcode ROM (not shown) along with replacement microcode values for those addresses. Finally, cache correction (i.e., "repair") mechanisms may comprise very sparse settings of ones to indicate substitution control signals to replace a certain cache sub-bank element (i.e., a row or a column) with a particular replacement sub-bank element to enable the repair of one or more cache memories.

Fuse arrays 102 provide an excellent means for configuring a device such as a microprocessor core 101 subsequent to fabrication of the device. By blowing selected fuses in the fuse array 102, the core 101 can be configured for operation in its intended environment. Yet, as one skilled in the art will appreciate, operating environments may change following programming of the fuse array 102. Business requirements may dictate that a device 101 originally configured as, say, as desktop device 101, be reconfigured as a mobile device 101. Accordingly, designers have provided techniques that utilize redundant banks of fuses within the fuse array 102 to provide for "unblowing" selected fuses therein, thus enabling the device 101 to be reconfigured, fabrication errors to be corrected, and etc. These redundant array techniques will now be discussed with reference to FIG. 2.

Referring now to FIG. 2, a block diagram 200 is presented depicting a fuse array 201 within the microprocessor core 101 of FIG. 1 including redundant fuse banks 202 RFB1-RFBN that that may be blown subsequent to blowing first fuse banks 202 PFB1-PFBN within the fuse array 201. Each of the fuse banks 202 PFB1-PFBN, RFB1-RFBN comprises a prescribed number of individual fuses 203 corresponding to specific design of the core 101. For example, the number of fuses 203 in a given fuse bank 202 may be 64 fuses 203 in a 64-bit microprocessor core 101 to facilitate provision of configuration data in a format that is easily implemented in the core 101.

The fuse array 201 is coupled to a set of registers 210-211 that are typically disposed within reset logic in the core 101. A primary register PR1 is employed to read one of the first fuse banks PFB1-PFBN (say, PFB3 as is shown in the diagram 200) and a redundant register RR1 is employed to read a corresponding one of the redundant fuse banks RFB1-RFBN. The registers 210-211 are coupled to exclusive-OR logic 212 that generates an output FB3.

In operation, subsequent to fabrication of the core 101, the first fuse banks PFB1-PFBN are programmed by known techniques with configuration data for the core 101. The redundant fuse banks RFB1-RFBN are not blown and remain at a logic low state for all fuses therein. Upon power-up/reset of the core 101, both the first fuse banks PFB1-PFBN and the redundant fuse banks RFB1-RFBN are read as required for configuration into the primary and redundant registers 210-211, respectively. The exclusive-OR logic 212 generates the output FB3 that is a logical exclusive-OR result of the contents of the registers 210-211. Since all of the redundant fuse banks are unblown (i.e., logic low states), the output FB3 value is simply that which was programmed into the first fuse banks PFB1-PFBN subsequent to fabrication.

Consider now, though, that design or business requirements dictate that some of the information that was programmed into the first fuse banks PFB1-PFBN needs to change. Accordingly, a programming operation is performed to blow corresponding fuses 203 within the redundant fuse banks RFB1-RFBN in order to change the information that is read at power-up. By blowing a fuse 203 in a selected redundant bank RFB1-RFBN, the value of a corresponding fuse 203 in the primary fuse bank PFB1-PFBN is logically complemented.

The mechanism of FIG. 2 may be employed to provide for "reblow" of fuses 203 within a device 101, but as one skilled in the art will appreciate, a given fuse 203 may only be reblown one time as there is only one set of redundant fuse banks RFB1-RFBN. To provide for additional reblows, a corresponding number of additional fuse banks 202 and registers 210-211 must be added to the part 101.

Heretofore, the fuse array mechanisms as discussed above with reference to FIGS. 1-2 has provided enough flexibility to sufficiently configure microprocessor cores and other related devices, while also allowing for a limited number of reblows. This is primarily due to the fact that former fabrication technologies, say 65 nanometer and 45 nanometer processes, allow ample real estate on a die for the implementation of enough fuses to provide for configuration of a core 101 disposed on the die. However, the present inventors have observed that present day techniques are limited going forward due to two significant factors. First, the trend in the art is to dispose multiple device cores 101 on a single die to increase processing performance. These so-called multi-core devices may include, say, 2-16 individual cores 101, each of which must be configured with fuse data upon power-up/reset. Accordingly, for a 4-core device, four fuse arrays 201 are required in that some of the data associated with individual cores may vary (e.g., cache correction data, redundant fuse data, etc.). Secondly, as one skilled in the art will appreciate, as fabrication process technologies shrink to, say, 32 nanometers, while transistor size shrinks accordingly, fuse size increases, thus requiring more die real estate to implement the same size fuse array on a 32-nanometer die opposed to that on a 45-nanometer die.

Both of the above limitations, and others, pose significant challenges to device designers, and more specifically to multi-core device designers, and the present inventors note that significant improvements over conventional device configuration mechanisms can be implemented in accordance with the present invention, which allows for programming of individual cores in a multi-core device along with substantial increases in cache correction and fuse reprogramming ("reblow") elements. The present invention will now be discussed with reference to FIGS. 3-12.

Figure 3:
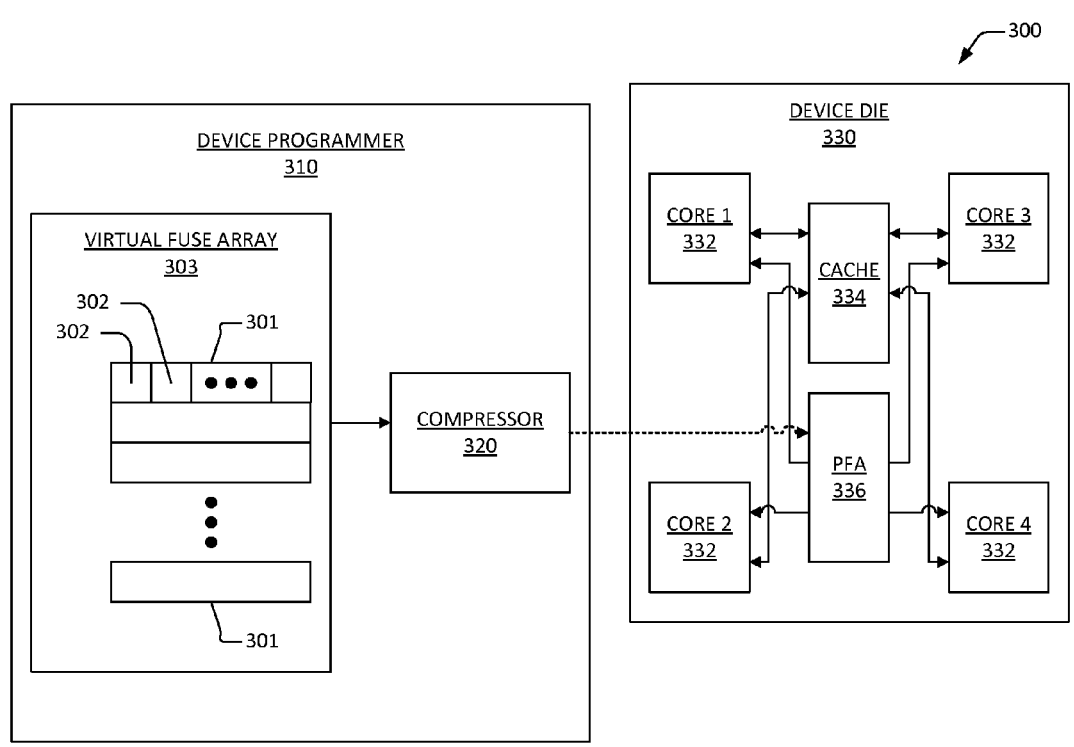
FIG. 3 is a block diagram featuring a system according to the present invention that provides for compression and decompression of configuration data for a multi-core device.

Turning to FIG. 3, a block diagram is presented featuring a system 300 according to the present invention that provides for compression and decompression of configuration/repair data for a multi-core device. The multi-core device comprises a plurality of cores 332 disposed on a die 330. For illustrative purposes, four cores 332 CORE 1-CORE 4 are depicted on the die 330, although the present invention contemplates various numbers of cores 332 disposed on the die 330. In one embodiment, all the cores 332 share a single cache memory 334 that is also disposed on the die 330. A single programmable fuse array 336 is also disposed on the die 330 and each of the cores 332 are configured to access the fuse array 336 to retrieve and decompress configuration data as described above during power-up/reset.

In one embodiment, the cores 332 comprise microprocessor cores configured as a multi-core microprocessor 330. In another embodiment, the multi-core microprocessor 330 is configured as an x86-compatible multi-core microprocessor. In yet another embodiment, the cache 334 comprises a level 2 (L2) cache 334 associated with the microprocessor cores 332. In one embodiment, the fuse array 336 comprises 8192 (8K) individual fuses (not shown), although other numbers of fuses are contemplated. In a single-core embodiment, only one core 332 is disposed on the die 330 and the core 332 is coupled to the cache 334 and physical fuse array 336. The present inventors note that although features and functions of the present invention will henceforth be discussed in the context of a multi-core device 330, these features and functions are equally applicable to a single-core embodiment as well.

The system 300 also includes a device programmer 310 that includes a compressor 320 that is coupled to a virtual fuse array 303. In one embodiment, the device programmer 310 may comprise a CPU (not shown) that is configured to process configuration data and to program the fuse array 336 following fabrication of the die 330 according to well known programming techniques. The CPU may be integrated into a wafer test apparatus that is employed to test the device die 330 following fabrication. In one embodiment, the compressor 320 may comprise an application program that executes on the device programmer 310 and the virtual fuse array 303 may comprise locations within a memory that is accessed by the compressor 320. The virtual fuse array 303 includes a plurality of virtual fuse banks 301, that each comprise a plurality of virtual fuses 302. In one embodiment, the virtually fuse array 303 comprises 128 virtual fuse banks 301 that each comprise 64 virtual fuses 302, resulting in a virtual array 303 that is 8 Kb in size.

Operationally, configuration information for the device 330 is entered into the virtual fuse array 303 as part of the fabrication process, and as is described above with reference to FIG. 1. Accordingly, the configuration information comprises control circuits configuration data, initialization data for microcode registers, microcode patch data, and cache correction data. Further, as described above, the distributions of values for associated with each of the data types is substantially different from type to type. The virtual fuse array 303 is a logical representation of a fuse array (not shown) that comprises configuration information for each of the microprocessor cores 332 on the die 330 and correction data for each of the caches 334 on the die 330.

After the information is entered into the virtual fuse array 303, the compressor 320 reads the state of the virtual fuses 302 in each of the virtual fuse banks 301 and compresses the information using distinct compression algorithms corresponding to each of the data types to render compressed fuse array data 303. In one embodiment, system data for control circuits is not compressed, but rather is transferred without compression. To compress microcode register data, a microcode register data compression algorithm is employed that is effective for compressing data having a state distribution that corresponds to the microcode register data. To compress microcode patch data, a microcode patch data compression algorithm is employed that is effective for compressing data having a state distribution that corresponds to the microcode patch data. To compress cache correction data, a cache correction data compression algorithm is employed that is effective for compressing data having a state distribution that corresponds to the cache correction data.

The device programmer 310 then programs the uncompressed and compressed fuse array data into the physical fuse array 336 on the die 330.

Upon power-up/reset, each of the cores 332 may access the physical fuse array 336 to retrieve the uncompressed and compressed fuse array data, and reset circuits/microcode (not shown) disposed within each of the cores 332 distributes the uncompressed fuse array data, and decompresses the compressed fuse array data according to distinct decompression algorithms corresponding to each of the data types noted above to render values originally entered into the virtual fuse array 303. The reset circuits/microcode then enter the configuration information into control circuits (not shown), microcode registers (not shown), patch elements (not shown), and cache correction elements (not shown).

Advantageously, the fuse array compression system 300 according to the present invention enables device designers to employ substantially fewer numbers of fuses in a physical fuse array 336 over that which has heretofore been provided, and to utilize the compressed information programmed therein to configure a multi-core device 330 during power-up/reset.

Figure 4:
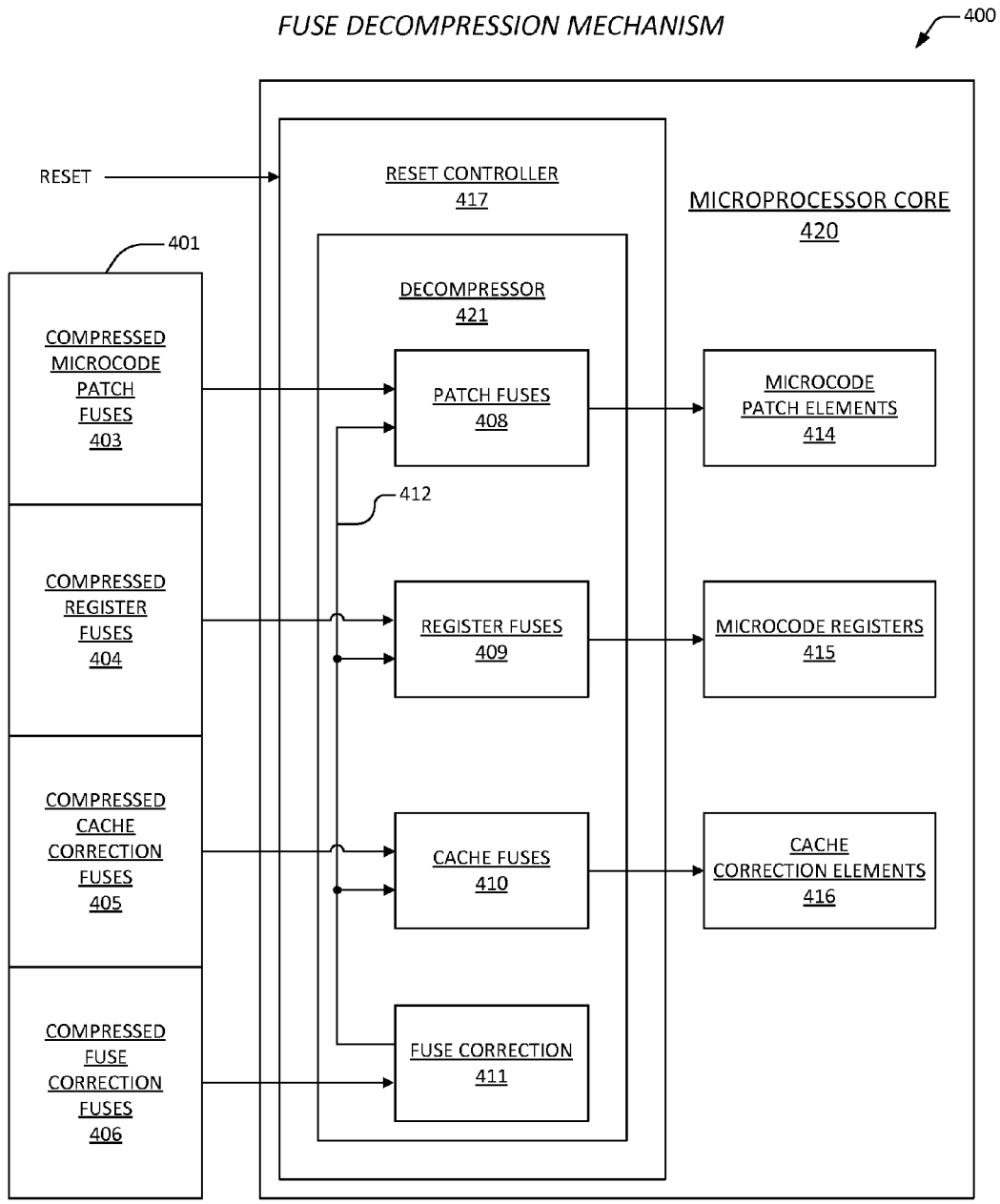
FIG. 4 is a block diagram showing a fuse decompression mechanism according to the present invention.

Turning now to FIG. 4, a block diagram 400 is presented showing a fuse decompression mechanism according to the present invention. The decompression mechanism may be disposed within each of the microprocessor cores 332 of FIG. 3. For purposes of clearly teaching the present invention, only one core 420 is depicted in FIG. 4 and each of the cores 332 disposed on the die comprise substantially equivalent elements as the core 420 shown. A physical fuse array 401 disposed on the die as described above is coupled to the core 420. The physical fuse array 401 comprises compressed microcode patch fuses 403, compressed register fuses 404, compressed cache correction fuses 405, and compressed fuse correction fuses 406. The physical fuse array 401 may also comprise uncompressed configuration data (not shown) such as system configuration data as discussed above and/or block error checking and correction (ECC) codes (not shown). The inclusion of ECC features according to the present invention will be discussed in further detail below.

The microprocessor core 420 comprises a reset controller 417 that receives a reset signal RESET which is asserted upon power-up of the core 420 and in response to events that cause the core 420 to initiate a reset sequence of steps. The reset controller 417 includes a decompressor 421. The decompressor 421 has a patch fuses element 408, a register fuses element 409, and a cache fuses element 410. The decompressor also comprises a fuse correction element 411 that is coupled to the patch fuses element 408, the register fuses element 409, and the cache fuses element 410 via bus 412. The patch fuses decompressor is coupled to microcode patch elements 414 in the core 420. The register fuses element 409 is coupled to microcode registers 415 in the core 420. And the cache fuses element 410 is coupled to cache correction elements 416 in the core 420. In one embodiment, the cache correction elements 416 are disposed within an on-die L2 cache (not shown) that is shared by all the cores 420, such as the cache 334 of FIG. 3. Another embodiment contemplates cache correction elements 416 disposed within an L1 cache (not shown) within the core 420. A further embodiment considers cache correction elements 416 disposed to correct both the L2 and L1 caches described above. Other embodiments contemplate a plurality of on-core caches and a shared cache that is not on-core.

In operation, upon assertion of RESET the reset controller 416 reads the states of the fuses 402-406 in the physical fuse array 401 and distributes the states of the compressed system fuses 402 to the decompressor 421. After the fuse data has been read and distributed, the fuse correction element 411 of the decompressor 421 decompresses the compressed fuse correction fuses states to render data that indicates one or more fuse addresses in the physical fuse array 401 whose states are to be changed from that which was previously programmed. The data may also include a value for each of the one or more fuse addresses. The one or more fuse addresses (and optional values) are routed via bus 412 to the elements 408-410 so that the states of corresponding fuses processed therein are changed prior to decompression of their corresponding compressed data.

In one embodiment, the patch fuses element 408 comprises microcode that operates to decompress the states of the compressed microcode patch fuses 403 according to a microcode patch decompression algorithm that corresponds the microcode patch compression algorithm described above with reference to FIG. 3. In one embodiment, the register fuses element 409 comprises microcode that operates to decompress the states of the compressed register fuses 404 according to a register fuses decompression algorithm that corresponds to the register fuses compression algorithm described above with reference to FIG. 3. In one embodiment, the cache fuses element 410 comprises microcode that operates to decompress the states of the compress cache correction fuses 405 according to a cache correction fuses decompression algorithm that corresponds to the cache correction fuses compression algorithm described above with reference to FIG. 3. After each of the elements 408-410 change the states of any fuses whose addresses (and optional values) are provided via bus 412 from the fuse correction element 411, their respective data is decompressed according to the corresponding algorithm employed. As will be described in further detail below, the present invention contemplates multiple "reblows" of any fuse address within the physical fuse array prior to the initiation of the decompression process executed by any of the decompressors 407-411. In one embodiment bus 412 may comprise conventional microcode programming mechanisms that are employed to transfer data between respective routines therein. The present invention further contemplates a comprehensive decompressor 421 having capabilities to recognize and decompress configuration data based upon its specific type. Accordingly, the recited elements 408-411 within the decompressor 421 are presented in order to teach relevant aspects of the present invention, however, contemplated implementations of the present invention may not necessarily include distinct elements 408-411, but rather a comprehensive decompressor 421 that provides functionality corresponding to each of the elements 408-411 discussed above.

In one embodiment, the reset controller 417 initiates execution of microcode within the patch fuses element 408 to decompress the states of the compressed microcode patch fuses 403. The reset controller 417 also initiates execution of microcode within the register fuses element 409 to decompress the states of the compressed register fuses 404. And the reset controller 417 further initiates execution of microcode within the cache fuses element 410 to decompress the states of the compressed cache correction fuses 406. The microcode within the decompressor 421 also operates to change the states of any fuses addressed by fuse correction data provided by the compressed fuse correction fuses 406 prior to decompression of the compressed data.

The reset controller 417, decompressor 421, and elements 408-411 therein according to the present invention are configured to perform the functions and operations as discussed above. The reset controller 417, decompressor 421, and elements 408-411 therein may comprise logic, circuits, devices, or microcode, or a combination of logic, circuits, devices, or microcode, or equivalent elements that are employed to execute the functions and operations according to the present invention as noted. The elements employed to accomplish these operations and functions within the reset controller 417, decompressor 421, and elements 408-411 therein may be shared with other circuits, microcode, etc., that are employed to perform other functions and/or operations within the reset controller 417, decompressor 421, and elements 408-411 therein or with other elements within the core 420.

After the states of the fuses 403-406 within the physical fuse array 401 have been changed and decompressed, the states of the decompressed "virtual" fuses are then routed, as appropriate to the microcode patch elements 414, the microcode registers 415, and the cache correction elements 416. Accordingly, the core 420 is configured for operation following completion of a reset sequence.

The present inventors note that the decompression functions discussed above need not necessarily be performed in a particular order during a reset sequence. For example, microcode patches may be decompressed following decompression of microcode registers initialization data. Likewise, the decompression functions may be performed in parallel or in an order suitable to satisfy design constraints.

Furthermore, the present inventors note that the implementations of the elements 408-411 need not necessarily be implemented in microcode versus hardware circuits, since in a typical microprocessor core 420 there exist elements of the core 420 which can more easily be initialized via hardware (such as a scan chain associated with a cache) as opposed to direct writes by microcode. Such implementation details are left up to designer judgment. However, the present inventors submit that the prior art teaches that cache correction fuses are conventionally read and entered into a cache correction scan chain by hardware circuits during reset prior to initiating the execution of microcode, and it is a feature of the present invention to implement the cache fuses decompressor 410 in microcode as opposed to hardware control circuits since a core's caches are generally not turned on until microcode runs. By utilizing microcode to implement the cache fuses element 410, a more flexible and advantageous mechanisms is provided for entering cache correction data into a scan chain, and significant hardware is saved.

Figure 5:
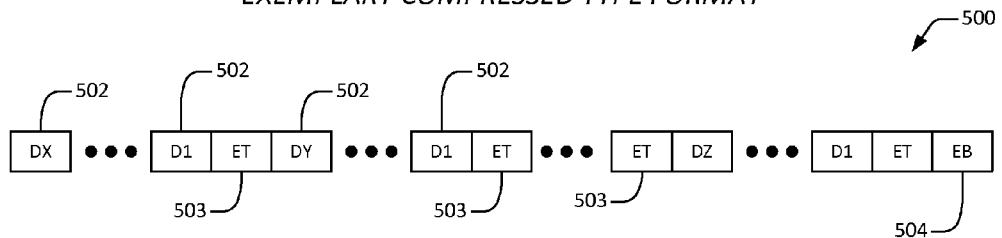
FIG. 5 is a block diagram illustrating an exemplary format for compressed configuration data according to the present invention.

Now referring to FIG. 5, a block diagram is presented illustrating an exemplary format 500 for compressed configuration data 500 according to the present invention. The compressed configuration data 500 is compressed by the compressor 320 of FIG. 3 from data residing in the virtual fuse array 303 and is programmed (i.e., "blown") into the physical fuse array 336 of the multi-core device 330. During a reset sequence, as is described above, the compressed configuration data 500 is retrieved from the physical fuse array 336 by each of the cores 332 and is decompressed and corrected by the elements 408-411 of the decompressor 421 within each of the cores 420. The decompressed and corrected configuration data is then provided to the various elements 413-416 within the core 420 to initialize the core 420 for operation.

The compressed configuration data 500 comprises one or more compressed data fields 502 for each of the configuration data types discussed above and are demarcated by end-of-type fields 503. Programming events (i.e., "blows") are demarcated by an end-of-blow field 504. The compressed data fields 502 associated with each of the data types are encoded according to a compression algorithm that is optimized to minimize the number of bits (i.e., fuses) that are required to store the particular bit patterns associated with each of the data types. The number of fuses in the physical fuse array 336 that make up each of compressed data fields 502 is a function of the compression algorithm that is employed for a particular data type. For example, consider a core that comprises sixty-four 64-bit microcode registers which must be initialized to, say, all ones or all zeros. An optimum compression algorithm may be employed to yield 64 compressed data fields 502 for that data type, where each of the compressed data fields 502 comprises initialization data for a particular microcode register where the compressed data fields 502 are prescribed in register number order (i.e., 1-64). And each of the compressed data fields 502 comprises a single fuse which is blown if a corresponding microcode register is initialized to all ones, and which is not blown if the corresponding microcode register is initialized to all zeros.

The elements 408-410 of the decompressor 421 in the core 420 are configured to utilize the end-of-type fields 503 to determine where their respective compressed data is located within the physical fuse array 336 and the fuse correction decompressor 411 is configured to utilize the end-of-blow fields 504 to locate compressed fuse correction data that has been programmed (i.e., blown) subsequent to an initial programming event. It is a feature of the present invention to provide a substantial amount of spare fuses in the physical fuse array 336 to allow for a significant number of subsequent programming events, as will be discussed in more detail below.

The exemplary compressed type format discussed above is presented to clearly teach aspects of the present invention that are associated with compression and decompression of configuration data. However, the manner in which specific type data is compressed, demarcated, and the number and types of data to be compressed within the fuse array 401 is not intended to be restricted to the example of FIG. 5. Other numbers, types, and formats are contemplated that allow for tailoring of the present invention to various devices and architectures extant in the art.

Figure 6:
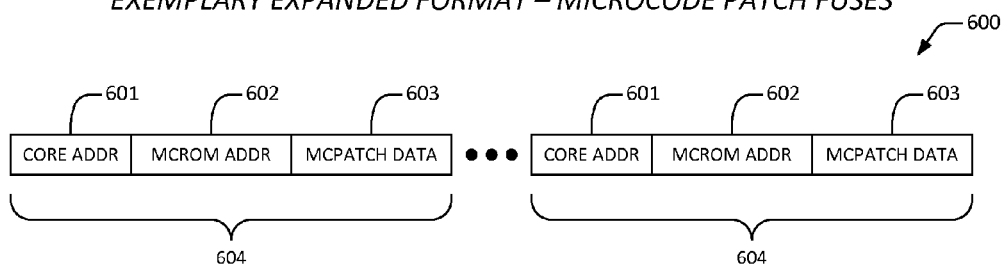
FIG. 6 is a block diagram illustrating an exemplary format for decompressed microcode patch configuration data according to the present invention.

Turning now to FIG. 6, a block diagram is presented illustrating an exemplary format for decompressed microcode patch configuration data 600 according to the present invention. During a reset sequence, compressed microcode patch configuration data is read by each core 420 from the physical fuse array 401. The compressed microcode patch configuration data is then corrected according to fuse correction data provided via bus 412. Then, the corrected compressed microcode patch configuration data is decompressed by the patch fuses decompressor 408. The result of the decompression process is the decompressed microcode patch configuration data 600. The data 600 comprises a plurality of decompressed data blocks 604 corresponding to the number of microcode patch elements 414 within the core 420 that require initialization data. Each decompressed data block 604 comprises a core address field 601, a microcode ROM address field 602, and a microcode patch data field 603. The sizes of the fields 601-603 are a function of the core architecture. As part of the decompression process, the patch fuses decompressor 408 creates a complete image of the target data required to initialize the microcode patch elements 414. Following decompression of the microcode patch configuration data 600, conventional distribution mechanisms may be employed to distribute the data 603 to respectively addressed core and microcode ROM substitution circuits/registers in the microcode patch elements 414.

Figure 7:
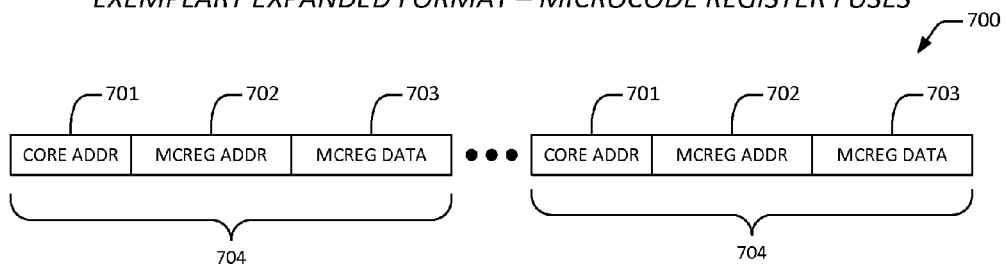
FIG. 7 is a block diagram depicting an exemplary format for decompressed microcode register configuration data according to the present invention.

Now turning to FIG. 7, a block diagram is presented depicting an exemplary format for decompressed microcode register configuration data 700 according to the present invention. During a reset sequence, compressed microcode register configuration data is read by each core 420 from the physical fuse array 401. The compressed microcode register configuration data is then corrected according to fuse correction data provided via bus 412. Then, the corrected compressed microcode register configuration data is decompressed by the register fuses decompressor 407. The result of the decompression process is the decompressed microcode register configuration data 700. The data 700 comprises a plurality of decompressed data blocks 704 corresponding to the number of microcode registers 415 within the core 420 that require initialization data. Each decompressed data block 704 comprises a core address field 701, a microcode register address field 702, and a microcode register data field 703. The sizes of the fields 701-703 are a function of the core architecture. As part of the decompression process, the register fuses decompressor 407 creates a complete image of the target data required to initialize the microcode registers 415. Following decompression of the microcode register configuration data 700, conventional distribution mechanisms may be employed to distribute the data 703 to respectively addressed core and microcode registers 415.

Figure 8:
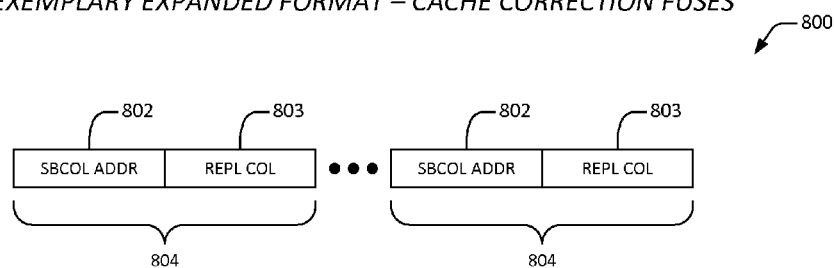
FIG. 8 is a block diagram featuring an exemplary format for decompressed cache correction data according to the present invention.

Referring now to FIG. 8, a block diagram is presented featuring an exemplary format for decompressed cache correction data 800 according to the present invention. During a reset sequence, compressed cache correction data is read by each core 420 from the physical fuse array 401. The compressed cache correction data is then corrected according to fuse correction data provided via bus 412. Then, the corrected compressed cache correction data is decompressed by the cache fuses decompressor 410. The result of the decompression process is the decompressed cache correction data 800. Various cache mechanisms may be employed in the multi-core processor 330 and the decompressed cache correction data 800 is presented in the context of a shared L2 cache 334, where all of the cores 332 may access a single cache 334, utilizing shared areas. Accordingly, the exemplary format is provided according to the noted architecture. The data 800 comprises a plurality of decompressed data blocks 804 corresponding to the number of cache correction elements 416 within the core 420 that require corrective data. Each decompressed data block 804 a sub-unit column address field 802 and a replacement column address field 803. As one skilled in the art will appreciate, memory caches are fabricated with redundant columns (or rows) in sub-units of the caches to allow for a functional redundant column (or row) in a particular sub-unit to be substituted for a non-functional column (or row). Thus, the decompressed cache correction data 800 allows for substitution of functional columns (as shown in FIG. 8) for non-functional columns. In addition, as one skilled in the art will concur, conventional fuse array mechanisms associated with cache correction include fuses associated with each sub-unit column that are blown when substitution is required by redundant sub-unit columns. Accordingly, because such a large number of fuses are required (to address all sub-units and columns therein), only a portion of the sub-units are typically covered, and then the resulting conventional cache correction fuses are very sparsely blown. And the present inventors note that it is a feature of the present invention to address and compress sub-unit column addresses and replacement column addresses only for those sub-unit columns that require replacement, thus minimizing the number of fuses that are required to implement cache correction data. Consequently, the present invention, as limited by physical fuse array size and the amount of additional configuration data that is programmed therein, provides the potential for expanding the number of sub-unit columns (or rows) in a cache 334 that can be corrected over that which has heretofore been provided. In the embodiment shown in FIG. 8, it is noted that the associated cores 332 are configured such that only one of the cores 334 sharing the L2 cache 334 would access and provide the corrective data 802-803 to its respective cache correction elements 416. The sizes of the fields 802-803 are a function of the core architecture. As part of the decompression process, the cache correction fuses decompressor 410 creates a complete image of the target data required to initialize the cache correction elements 416. Following decompression of the cache correction data 800, conventional distribution mechanisms in the responsible core 420 may be employed to distribute the data 802-803 to respectively addressed cache correction elements 416.

Figure 9:
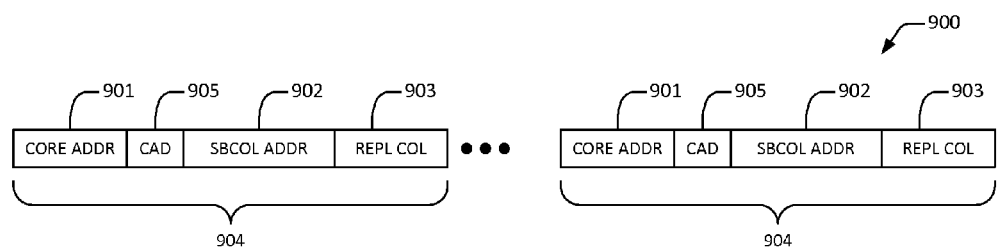
FIG. 9 is a block diagram showing an exemplary format for decompressed fuse correction data according to the present invention.

Turning to FIG. 9, a block diagram is presented featuring an alternative exemplary format for decompressed cache correction data 900 according to the present invention. The embodiment of FIG. 9 may be employed in a multi-core processor configuration such as that of FIG. 4, where each of the cores 420 comprise one or more on-core caches (not shown) including, but not limited to, a level one (L1) data cache and an L1 instruction cache. During a reset sequence, compressed cache correction data is read by each core 420 from the physical fuse array 401. The compressed cache correction data is then corrected according to fuse correction data provided via bus 412. Then, the corrected compressed cache correction data is decompressed by the cache fuses decompressor 410. The result of the decompression process is the decompressed cache correction data 900. The data 900 comprises a plurality of decompressed data blocks 904 corresponding to the number of cache correction elements 416 within the core 420 that require corrective data. Each decompressed data block 904 has a core address field 901, a cache address (CAD) field 905, a sub-unit column address field 902, and a replacement column address field 903. Thus, the decompressed cache correction data 800 allows for substitution of functional columns (or rows) for non-functional columns (or rows) within a cache specified by the CAD field 905, within a core 420 specified by the core address field 901. A predefined core address value in the core address field 901 may specify a shared cache, such as an L2 cache, that is not on-core. The sizes of the fields 901-903, 905 are a function of the core architecture. As part of the decompression process, the cache correction fuses decompressor 410 creates a complete image of the target data required to initialize the cache correction elements 416. Following decompression of the cache correction data 900, conventional distribution mechanisms in the responsible core 420 may be employed to distribute the data 901-903, 905 to respectively addressed cache correction elements 416.

Figure 10:
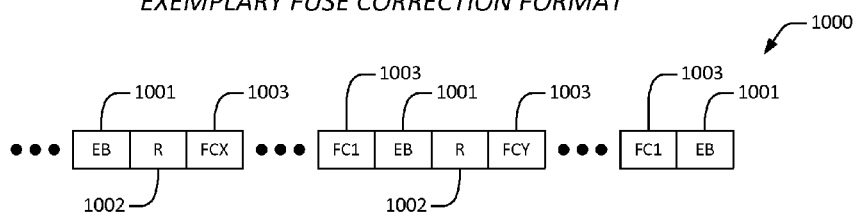
FIG. 10 is a block diagram showing an alternative exemplary format for decompressed fuse correction data according to the present invention.

Turning now to FIG. 10, a block diagram is presented showing an exemplary format for decompressed fuse correction data 1000 according to the present invention. As has been discussed above, during reset the fuse correction decompressor 411 accesses compressed fuse correction data 406 within the physical fuse array 401, decompresses the compressed fuse correction data, and supplies the resulting decompressed fuse correction data 1000 to the other decompressors 407-410 within the core 420. The decompressed fuse correction data comprises one or more end-of-blow fields 1001 that indicate the end of successively programming events in the physical fuse array 401. If a subsequent programming event has occurred, a reblow field 1002 is programmed to indicate that a following one or more fuse correction fields 1003 indicate fuses within the physical fuse array 401 that are to be reblown. Each of the fuse correction fields comprises an address of a specific fuse within the physical fuse array 401 that is to be reblown along with a state (i.e., blown or unblown) for the specific fuse. Only those fuses that are to be reblown are provided in the fuse correction blocks fields 1003, and each group of fields 1003 within a given reblow event is demarcated by an end-of-blow field 1001. If reblow field 1002, properly encoded, is present after a given end-of-blow field 1001, then subsequent one or more fuse fuses may be configured reblown as indicated by corresponding fuse correction fields. Thus, the present invention provides the capability for a substantial number of reblows for the same fuse, as limited by array size and other data provided therein.

The present inventors have also observed that the real estate and power gains associated with utilization of a shared physical fuse array within which compressed configuration data is stored presents opportunities for additional features disposed on a multi-core die. In addition, the present inventors have noted that, as one skilled in the art will appreciate, present day semiconductor fuse structures often suffer from several shortcomings, one of which is referred to as "growback." Growback is the reversal of the programming process such that a fuse will, after some time, reconnect after it has been blown, that is, it goes from a programmed (i.e., blown) state back to an unprogrammed (i.e., unblown) state.

In another aspect, as alluded to above, the present inventors have noted that there may exist challenges when power gating techniques are employed to minimize power consumption across a multi-core die, such as the die 330 of FIG. 3. Such techniques, which are beyond the scope of the present application, are employed to detect when one or more cores 332 are not being utilized, and in a varying number of ways, the one or more cores 332 are powered-down (also known as a power gating event). When a power-gated core 332 is required for execution, power is restored to the core 332 and it begins execution. Of specific interest to the present inventors is the case where a core 332 comprises one or more on-core caches, as is discussed with reference to FIG. 9, where power is removed from these caches under a power gating event. As one skilled in the art will appreciate, in order to power up the one or more caches following the power gating event, the one or more caches must first be configured using fuse correction data as is described above. However, one skilled will also appreciate that excessive reading of fuse arrays decreases the lifetime of the fuses therein. Another issue associated with power gating is the excessive time that may be required for each core to read cache correction fuses, to decompress compressed fuse repair data, and to configure corrections for each of its respective on-core caches. Accordingly, another embodiment of the present invention is provided to 1) decrease the amount of time required for all cores to decompress and configure their respective on-core caches following a power gating event, and 2) increase the overall lifetime of the fuse array by decreasing the number of accesses by the cores under power gating conditions.

Figure 11:
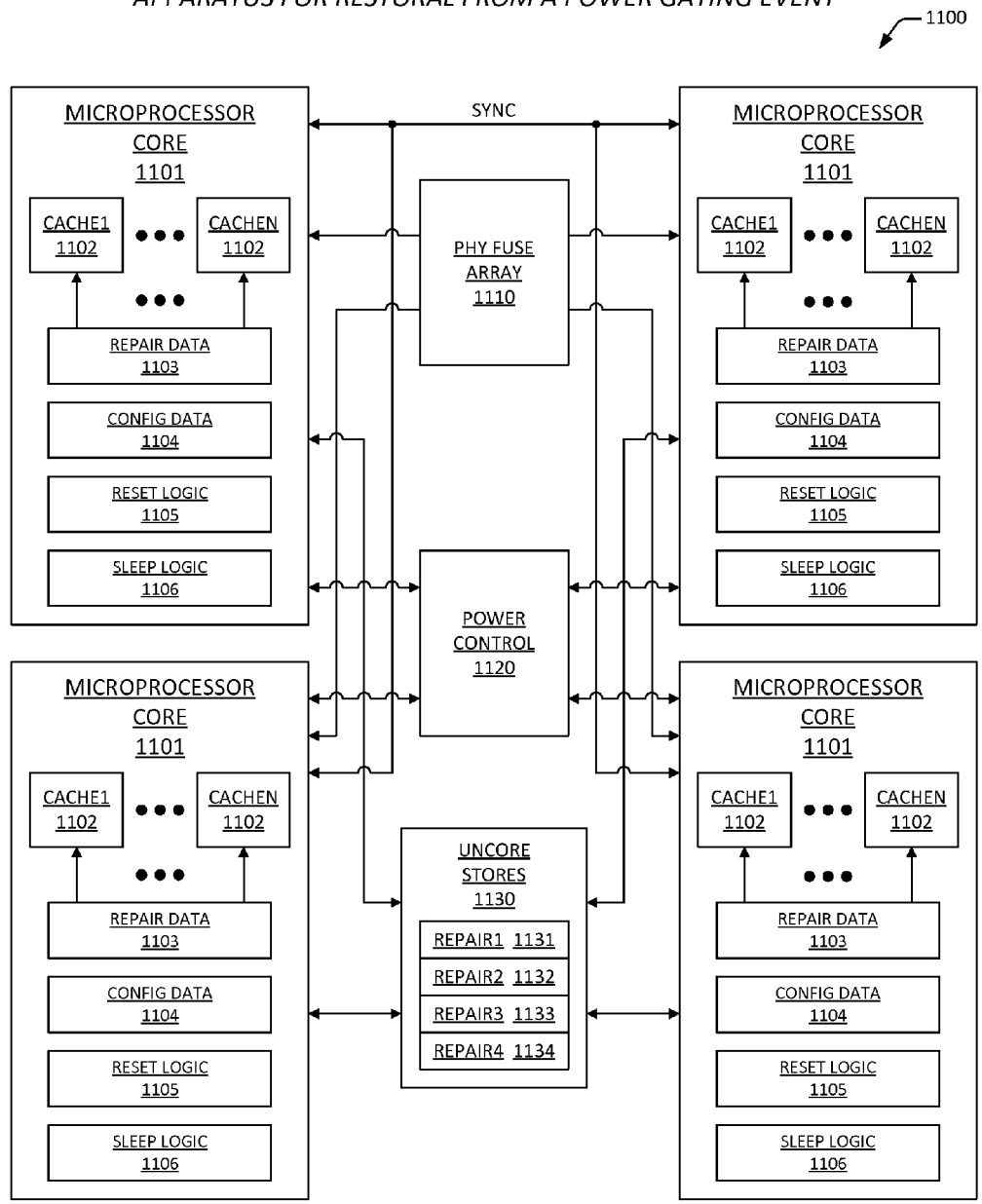
FIG. 11 is a block diagram illustrating an multi-core apparatus according to the present invention that provides for prompt restoral of cache repair data following a power gating event.

Attention is now directed to FIG. 11, where a block diagram is presented detailing a mechanism according to the present invention for rapidly loading cache correction data into a multi-core device 1100, initially and following a power gating event. The device 1100 includes a plurality of cores 1101 that are configured substantially as described above with reference to FIGS. 3-10. In addition, each of the cores 1101 includes one or more on-core caches CACHE1-CACHEN 1102, a cache repair stores 1103, a configuration data stores 1104, reset logic 1105, and sleep logic 1106. Each of the cores 1102 is coupled to a physical fuse array 1110 that is configured as described above with reference to FIGS. 3-10, and to a stores (e.g., random access memory (RAM)) 1130 that is disposed on the same die as the cores 1101, but which is not disposed within any of the cores 1101. Hence, the stores 1105 is henceforth referred to as "uncore" stores 1105. The uncore stores 1130 includes designated sub-stores 1131-1134 that each correspond to each of the cores 1101. The multi-core device 1100 further includes power control 1120 that is coupled to each of the cores 1101. A sync bus SYNC is coupled to each of the cores 1101 to provide for synchronization communications there between during power-up, reset, and power gating events.

For purposes of illustration, only four cores 1101, a single physical fuse array 1110, and a single uncore stores 1130 are shown, however the present inventors note that the novel and inventive concepts according to the present invention can be extended to a plurality of cores 1101, fuse arrays 1110, and uncore stores 1130 of any number. In one embodiment, the uncore stores 1130 comprises a random access memory (RAM) that retains power during a power gating event. In one embodiment, the uncore stores 1130 comprises a 4 KB RAM, though other sizes are contemplated.

In operation, the power control 1120 is configured to perform power gating in order to remove and restore power to one or more of the cores 1101. During power-up/reset, the reset logic 1105 on each of the cores 1101 is configured to perform, among other operations, configuration of the cores 1101 as is described above. In addition, the reset logic 1105 is configured to read the configuration data register 1104 to determine if a core 1101 is a master core or a slave core. If the configuration data indicates that a core 1101 is a slave core, as part of the reset process, the slave core waits until the master core signals over the synchronization bus SYNC that decompressed cache repair data for each of the cores 1101 has been read from the fuse array 1110 and has been written into corresponding sub-stores 1131-1134 within the uncore stores 1130. Upon indication over SYNC that the corresponding sub-stores 1131-1134 have been written, each of the slave cores reads their respective decompressed repair data from the corresponding sub-stores 1131-1134 and proceeds to configure their respective on-core caches as is described above. If the configuration data indicates that a core 1101 is a master core, then as part of power-up/reset, the master core reads cache correction data for all of the cores 1101 from the fuse array 1110, decompresses the compressed correction data for all of the cores 1101, and writes the decompressed cache repair data to the sub-stores 1131-1134 corresponding to each of the cores 1101. The master core then signals to the other cores 1101 over SYNC that writing of the decompressed cache repair data is completed.

During a power gating event, the power control 1120 removes power from one or more of the cores 1101 to the extent that power is also removed from the core's on-core caches 1102. However, power is not removed from the uncore stores 1130, thus preserving the decompressed repair data for each of the cores 1101. The sleep logic 1106 is configured to determine when power is restored to a respective core 1101 following a power gating event, to directly read cache repair data for its on-core caches from its respective sub-stores 1131-1134, and to configure its respective repair data stores 1103 for correction of its on-core caches 1102, thus drastically reducing the time required to return to operations following the power gating event, while concurrently substantially increasing the lifetime of the fuse array 1110.

Portions of the present invention and corresponding detailed description are presented in terms of software, or algorithms and symbolic representations of operations on data bits within a computer memory. These descriptions and representations are the ones by which those of ordinary skill in the art effectively convey the substance of their work to others of ordinary skill in the art. An algorithm, as the term is used here, and as it is used generally, is conceived to be a self-consistent sequence of steps leading to a desired result. The steps are those requiring physical manipulations of physical quantities. Usually, though not necessarily, these quantities take the form of optical, electrical, or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise, or as is apparent from the discussion, terms such as "processing" or "computing" or "calculating" or "determining" or "displaying" or the like, refer to the action and processes of a computer system, a microprocessor, a central processing unit, or similar electronic computing device, that manipulates and transforms data represented as physical, electronic quantities within the computer system's registers and memories into other data similarly represented as physical quantities within the computer system memories or registers or other such information storage, transmission or display devices.

Note also that the software implemented aspects of the invention are typically encoded on some form of program storage medium or implemented over some type of transmission medium. The program storage medium may be electronic (e.g., read only memory, flash read only memory, electrically programmable read only memory), random access memory magnetic (e.g., a floppy disk or a hard drive) or optical (e.g., a compact disk read only memory, or "CD ROM"), and may be read only or random access. Similarly, the transmission medium may be metal traces, twisted wire pairs, coaxial cable, optical fiber, or some other suitable transmission medium known to the art. The invention is not limited by these aspects of any given implementation.

The particular embodiments disclosed above are illustrative only, and those skilled in the art will appreciate that they can readily use the disclosed conception and specific embodiments as a basis for designing or modifying other structures for carrying out the same purposes of the present invention, and that various changes, substitutions and alterations can be made herein without departing from the scope of the invention as set forth by the appended claims.

What is claimed is:

1. An apparatus for providing configuration data to an integrated circuit, the apparatus comprising:
   a semiconductor fuse array, disposed on a die, into which is programmed compressed configuration data for a plurality of cores disposed on said die, and coupled to said semiconductor fuse array; and
   a stores, coupled to said plurality of cores, said stores comprising a plurality of sub-stores that each correspond to each of said plurality of cores, wherein one of said plurality of cores is configured to access said semiconductor fuse array upon power-up/reset to read and decompress said compressed configuration data, and to store a plurality of decompressed configuration data sets for one or more cache memories within said each of said plurality of cores in said plurality of sub-stores, and wherein, following a power gating event, one of said each of said plurality of cores subsequently accesses a corresponding one of said each of said plurality of sub-stores to retrieve and employ said decompressed configuration data sets to initialize said one or more caches.

2. The apparatus as recited in claim 1, wherein a cache fuses decompressor within said one of said plurality of cores decompresses said compressed configuration data by executing microcode during power-up/reset.

3. The apparatus as recited in claim 1, wherein said decompressed configuration data sets each comprise a first plurality of semiconductor fuses that indicates one or more sub-unit locations within one of said one or more cache memories that are not to be employed during normal operation.

4. The apparatus as recited in claim 3, wherein said decompressed configuration data sets each further comprises a second plurality of semiconductor fuses that indicates one or more replacement sub-unit locations within one of said one or more cache memories that are to be employed during normal operation in replacement of corresponding ones of said one or more sub-unit locations.

5. The apparatus as recited in claim 4, wherein said sub-unit locations and said replacement sub-unit locations comprise columns and redundant columns, respectively, within said one of said one or more cache memories.

6. The apparatus as recited in claim 4, wherein said sub-unit locations and said replacement sub-unit locations comprise rows and redundant rows, respectively, within said one of said one or more cache memories.

7. The apparatus as recited in claim 1, wherein the integrated circuit comprises an x86-compatible multi-core microprocessor.

8. An apparatus for providing configuration data to an integrated circuit device, the apparatus comprising:
   a multi-core microprocessor, comprising:
      a semiconductor fuse array, disposed on a die, into which is programmed compressed configuration data for a plurality of cores disposed on said die, and coupled to said semiconductor fuse array; and
      a stores, coupled to said plurality of cores, said stores comprising a plurality of sub-stores that each correspond to each of said plurality of cores, wherein one of said plurality of cores is configured to access said semiconductor fuse array upon power-up/reset to read and decompress said compressed configuration data, and to store a plurality of decompressed configuration data sets for one or more cache memories within said each of said plurality of cores in said plurality of sub-stores, and wherein, following a power gating event, one of said each of said plurality of cores subsequently accesses a corresponding one of said each of said plurality of sub-stores to retrieve and employ said decompressed configuration data sets to initialize said one or more caches.

9. The apparatus as recited in claim 8, wherein said cache fuses decompressor within said one of said plurality of cores decompresses said compressed configuration data by executing microcode during power-up/reset.

10. The apparatus as recited in claim 8, wherein said decompressed configuration data sets each comprise a first plurality of semiconductor fuses that indicates one or more sub-unit locations within one of said one or more cache memories that are not to be employed during normal operation.

11. The apparatus as recited in claim 10, wherein said decompressed configuration data sets each further comprises a second plurality of semiconductor fuses that indicates one or more replacement sub-unit locations within one of said one or more cache memories that are to be employed during normal operation in replacement of corresponding ones of said one or more sub-unit locations.

12. The apparatus as recited in claim 11, wherein said sub-unit locations and said replacement sub-unit locations comprise columns and redundant columns, respectively, within said one of said one or more cache memories.

13. The apparatus as recited in claim 11, wherein said sub-unit locations and said replacement sub-unit locations comprise rows and redundant rows, respectively, within said one of said one or more cache memories.

14. The apparatus as recited in claim 8, wherein said multi-core microprocessor comprises an x86-compatible multi-core microprocessor.

15. A method for configuring an integrated circuit, the method comprising:
 first disposing a semiconductor fuse array on a die, into which is programmed compressed configuration data for a plurality of cores disposed on the die, and coupled to the semiconductor fuse array; and
 second disposing a stores on the die, the stores comprising a plurality of sub-stores that each correspond to each of the plurality of cores, wherein one of the plurality of cores is configured to access the semiconductor fuse array upon power-up/reset to read and decompress the compressed configuration data, and to store a plurality of decompressed configuration data sets for one or more cache memories within the each of the plurality of cores in the plurality of sub-stores, and wherein, following a power gating event, one of the each of the plurality of cores subsequently accesses a corresponding one of the each of the plurality of sub-stores to retrieve and employ the decompressed configuration data sets to initialize the one or more caches.

16. The method as recited in claim 15, wherein a cache fuses decompressor within the one of the plurality of cores decompresses the compressed configuration data by executing microcode during power-up/reset.

17. The method as recited in claim 15, wherein the decompressed configuration data sets each comprise a first plurality of semiconductor fuses that indicates one or more sub-unit locations within one of the one or more cache memories that are not to be employed during normal operation.

18. The method as recited in claim 17, wherein the decompressed configuration data sets each further comprises a second plurality of semiconductor fuses that indicates one or more replacement sub-unit locations within one of the one or more cache memories that are to be employed during normal operation in replacement of corresponding ones of the one or more sub-unit locations.

19. The method as recited in claim 18, wherein the sub-unit locations and the replacement sub-unit locations comprise columns and redundant columns, respectively, within the one of the one or more cache memories.

20. The method as recited in claim 18, wherein the sub-unit locations and the replacement sub-unit locations comprise rows and redundant rows, respectively, within the one of the one or more cache memories.

21. The method as recited in claim 15, wherein the integrated circuit comprises an x86-compatible multi-core microprocessor.

\* \* \* \* \*